United States Patent
Yang et al.

(10) Patent No.: US 10,714,198 B1
(45) Date of Patent: Jul. 14, 2020

(54) DYNAMIC 1-TIER SCAN FOR HIGH PERFORMANCE 3D NAND

(71) Applicant: SanDisk Technologies LLC, Addison, TX (US)

(72) Inventors: Xiang Yang, San Jose, CA (US); Deepanshu Dutta, San Jose, CA (US); Huai-yuan Tseng, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/430,851

(22) Filed: Jun. 4, 2019

(51) Int. Cl.
  *G11C 16/34* (2006.01)
  *G11C 11/56* (2006.01)
  *G11C 16/10* (2006.01)
  *G11C 16/08* (2006.01)

(52) U.S. Cl.
  CPC ...... *G11C 16/3459* (2013.01); *G11C 11/5628* (2013.01); *G11C 16/08* (2013.01); *G11C 16/10* (2013.01)

(58) Field of Classification Search
  CPC ..... G11C 16/3459; G11C 16/10; G11C 16/08; G11C 11/5628
  See application file for complete search history.

(56) References Cited

U.S. PATENT DOCUMENTS 9,899,097 B2 * 2/2018 Kim ............... G11C 11/5671
2019/0267107 A1 * 8/2019 Joe ................. G11C 16/26

* cited by examiner

*Primary Examiner* — David Lam
(74) *Attorney, Agent, or Firm* — Dickinson Wright PLLC; Steven Hurles

(57) ABSTRACT

A method and system for executing a dynamic 1-tier scan on a memory array are provided. The memory array includes a plurality of memory cells organized into a plurality of sub-groups. The dynamic 1-tier scan includes executing an program loop in which cells of a first sub-group are counted to determine whether a numeric threshold is met, and, if the numeric threshold is met with respect to the first sub group, at least one additional program loop is executed in which cells of a second sub-group are counted to determine whether the numeric threshold is met with respect to the second sub-group.

12 Claims, 13 Drawing Sheets

DYNAMIC 1-TIER SCAN FOR HIGH PERFORMANCE 3D NAND

BACKGROUND

1. Field

Systems, apparatuses, and methods consistent with exemplary embodiments relate to programming of three dimensional (3D) NAND flash memories, and more specifically to 1-tier program verify operations for 3D NAND flash memory devices.

2. Description of the Related Art

3D NAND flash memory is a type of non-volatile flash memory in which memory cells are stacked vertically in multiple layers. 3D NAND was developed to address challenges encountered in scaling two dimensional (2D) NAND technology to achieve higher densities at a lower cost per bit.

A memory cell is an electronic device or component capable of storing electronic information. Non-volatile memory may utilize floating-gate transistors, charge trap transistors, or other transistors as memory cells. The ability to adjust the threshold voltage of a floating-gate transistor or charge trap transistor allows the transistor to act as a non-volatile storage element (i.e. a memory cell), such as a single-level cell (SLC) which stores a single bit of data. In some cases more than one data bit per memory cell can be provided (e.g., in a multi-level cell) by programming and reading multiple threshold voltages or threshold voltage ranges. Such cells include, but are not limited to a multi-level cell (MLC), storing two bits per cell; a triple-level cell (TLC), storing three bits per cell; and a quad-level cell (QLC), storing four bits per cell.

FIG. 1 illustrates a related art method of programming a 3D NAND word line (WL). When a program command is received (101), a program loop 120 is initiated, and multiple iterations 1, 2, . . . n of the program loop are performed. A "program loop" is a period of time encompassing a programming pulse and extending until another programming pulse is issued or until a particular program procedure comes to an end.

An initial threshold voltage (Vt) distribution of all of the cells is shown in FIG. 2A. In the first loop, a first programming voltage ($VPGM_1$) is applied to each of the cells via the word line (102). A verification pulse at a verify voltage is then applied to the word line, and the cells having a Vt greater than a verify level can be determined and counted (103). This is also called a verification process and a verification scan. It is described herein that a verify level is a Vt reached by a cell during programming. However, a verify level may by any level associated with a particular state that may be reached during programming or erasing of a memory cell. It is then determined whether a number (or percentage) of cells which have not reached the verify level is less than a numeric threshold (104). The numeric threshold may be, for example, a predetermined number of cells or a predetermined percentage of the cells. For example, the numeric threshold may be reached when fewer than 64 cells per 16 kB have not yet reached the verify level.

If the number (or percentage) of the cells not achieving the verify level is less than the numeric threshold (104: YES), the processes is finished (106). If the number (or percentage) of the cells not achieving the verify level is greater than the numeric threshold (104: NO), the process continues and another program loop 120 is performed. In each subsequent program loop (1, 2, 3, . . . n), the VPGM is increased, such that $VPGM_{i+1}=VPGM_i+\Delta VPGM$ (105), and the word line is programmed again with the increased $VPGM_{i+1}$ (102).

As shown in FIG. 2B, as the program loops are performed, the Vt distribution of the cells shifts to higher voltages (to the right, as shown in FIG. 2B). After a first one or more program loops, a state A is reached, as shown. After a further one or more program loops, a state B is reached, as shown. Thus, the Vt distribution shifts to higher voltages (A-E) until a satisfactory number (or percentage) of cells have reached the verify level (i.e. until the numeric threshold is achieved), as shown, for example, in state E. In this manner, subsequent steps of the programming can be delayed or avoided until a satisfactory number (or percentage) of the cells have reached the verify level and the numeric threshold is achieved.

One type of verification process or verification scan is an "all tier scan" in which every cell is counted to determine whether its Vt is higher than the verify level. Such an all tier scan can be quite time-consuming—typically taking about 15 µs.

It has been determined, however, that certain advantages enabling better performance can be achieved using a "1-tier scan" in which only a fraction of the total cells are counted.

According to a "1-tier scan," the cells of the word line are divided into sub-groups, called "tiers", and only those cells in a single tier are counted. Typically, a word line may be divided into 16 tiers. As only a fraction of the total cells in the word line are being counted, the use of a 1-tier scan greatly reduces programming time—a 1-tier scan may typically require only about 2 µs. However, for a 1-tier scan to be effective, the cells belonging to the scanned tier must be appropriately representative. This issue is related to whether the cells within the scanned tier are "fast" or "slow." Certain memory holes (MH), and therefore certain cells, may have faster programming speeds. This is due to the certain cells having a thinner tunneling oxide.

In order for a 1-tier scan to be successful and to sufficiently predict, by counting only a single tier in order to determine whether a numeric threshold has been reached, the cells in the tier that is selected to be scanned must be appropriately representative. FIG. 3A illustrates an exemplary break-down of the Vt distribution of all of the cells of a word line into the Vt distributions of two representative tiers: tier #0 and tier #1. According to this example, the Vt distributions of tier #0 and tier #1 show that, overall, the cells of tier #1 are faster than those of tier #0. As shown in FIG. 3B, one can see that if the slower tier #0 is selected to be counted, if a number (or percentage) the counted cells of tier #0 that have not reached the verify level (shown in the shaded region of FIG. 3B) is less than the numeric threshold, the cells of the faster tier #1 will also have reached the verify level and satisfy the numeric threshold. Thus, it is statistically safe to count only the slow tier, in a 1-tier scan, as representative of all of the cells.

However, the prediction of which cells and tiers are fast and slow is not always correct. In such cases, when tier #0 is chosen for the 1-tier scan, but is actually a fast tier, the count is not sufficiently representative. FIGS. 4A and 4B illustrate this problem. FIG. 4A illustrates an exemplary break-down of the Vt distribution of all of the cells in a word line into the Vt distributions of tier #0 and tier #1. In this example, the cells of tier #0 are actually faster than the cells of tier #1. As shown in FIG. 4B, one can see that if tier #0, which includes the faster cells, is selected for the 1-tier scan, the counted cells of the selected tier #0 may satisfy the numeric threshold, even though a lower tail results, of cells which have still not reached the verify level, as shown in the shaded region of FIG. 4B. In other words, in the case in which the selected tier is actually faster, the 1-tier scan indicates that the numeric threshold has been reached with respect to the selected tier, even though it has not been reached with respect to all of the cells. This often causing data errors such as under programming or over programming. Over programming can result if, for example, a tier is selected as being the fastest subgroup, but is not the fastest subgroup. Alternatively, if a tier is selected as being the slowest subgroup but is not the slowest subgroup, under programming can result.

SUMMARY

Exemplary embodiments may address at least the above problems and/or disadvantages and other disadvantages not described above. Also, exemplary embodiments are not required to overcome the disadvantages described above, and may not overcome any of the problems described above.

According to an aspect of an exemplary embodiment, a non-volatile memory storage system comprises: a memory cell array coupled to a word line, a dynamic 1-tier circuit comprising a programming circuit and a determination/counting circuit. The memory cell array comprises a plurality of memory cells organized into a plurality of distinct sub-groups The dynamic 1-tier circuit is configured to execute a program loop and an additional program loop. The program loop comprises: the programming circuit applying one or more programming pulses to the word line, and applying a verify voltage to the word line; the determination/counting circuit counting a number of first memory cells that have achieved a verify level, the first memory cells being within a first sub-group of the plurality of sub-groups; and determining, based on the number of the first memory cells that have achieved the verify level, whether the first sub-group meets a numeric threshold. If the first sub-group does not meet the numeric threshold, the programming circuit increases a voltage of the programming pulses and repeats the program loop, and if the first sub-group meets numeric threshold, the dynamic 1-tier circuit executes the additional program loop. The additional program loop comprises: the determination/counting circuit counting a number of second memory cells that have achieved the verify level, the second memory cells being within a second sub-group of the plurality of sub-groups, and determining, based on the number of the second memory cells that have achieved the verify level, whether the second sub-group meets the numeric threshold. If the second sub-group does not meet the numeric threshold, the programming circuit increases the voltage of the programming pulses, applies one or more of the programming pulses to the word line, and applies the verify voltage to the word line, and the dynamic 1-tier circuit repeats the additional program loop. If the second sub-group meets the numeric threshold, the programming process is finished.

The memory cells of the first sub-group may be adjacent to a trench, and the second memory cells of the second sub-group may be spaced apart from the trench, such that the first memory cells are disposed between the second memory cells and the trench.

The additional program loop may be a primary additional program loop, and the dynamic 1-tier circuit may be further configured to execute a secondary additional program loop and a tertiary additional program loop. If the second sub-group meets the numeric threshold, the dynamic 1-tier circuit may the secondary additional program loop. The secondary additional program loop comprises: the determination/counting circuit counting a number of third memory cells that have achieved the verify level, the third memory cells being within a third sub-group of the plurality of sub-groups, and determining, based on the number of the third memory cells that have achieved the verify level, whether the third sub-group meets the numeric threshold. If the third sub-group does not meet the numeric threshold, the programming circuit increases the voltage of the programming pulses, applies one or more programming pulses to the word line, and applies the verify voltage to the word line, and the dynamic 1-tier circuit repeats the secondary additional program loop. If the third sub-group meets the numeric threshold, the dynamic 1-tier circuit executes the tertiary additional program loop. The tertiary additional program loop comprises: the programming circuit applying the verify voltage to the word line; the determination/counting circuit counting a number of fourth memory cells that have achieved the verify level, the fourth memory cells being within a fourth sub-group of the plurality of sub-groups, and determining, based on the number of the fourth memory cells that have achieved the verify level, whether the fourth sub-group meets the numeric threshold. If the fourth sub-group does not meet the numeric threshold, the programming circuit increases the voltage of the programming pulses, applies one or more programming pulses to the word line, and applies the verify voltage to the word line, and the dynamic 1-tier circuit repeats the tertiary additional program loop. If the fourth sub-group meets the numeric threshold, the programming process is finished.

The third memory cells of the third sub-groups may be adjacent to the first memory cells and disposed between the first memory cells and the second memory cells. The fourth memory cells of the fourth sub-group may be adjacent to the second memory cells and disposed between the third memory cells and the second memory cells.

According to an aspect of another exemplary embodiment, a memory programming method comprises: executing a program loop comprising: applying one or more programming pulses to a word line coupled to a memory cell array comprising a plurality of memory cells organized into a plurality of distinct sub-groups, applying a verify voltage to the word line, counting a number of first memory cells that have achieved a verify level, the first memory cells being within a first sub-group of the plurality of sub-groups, determining, based on the number of the first memory cells that have achieved the verify level, whether the first sub-group meets a numeric threshold. If the first sub-group does not meet the numeric threshold, the method further comprises increasing a voltage of the programming pulse, and repeating the program loop. If the numeric threshold is met, the method further comprises executing an additional program loop. The additional program loop comprises: counting a number of second memory cells that have achieved the verify level, the second memory cells being within a second sub-group of the plurality of sub-groups, determining, based on the number of the second memory cells that have achieved the verify level, whether the second sub-group meets the numeric threshold. If the second sub-group does not meet the numeric threshold, the method further comprises increasing the voltage of the programming pulses, applying one or more of the programming pulses to the word line, applying the verify voltage to the word line, and repeating the additional program loop.

The additional program loop may be a primary additional program loop, and the method may further comprise: if the second sub-group meets the numeric threshold, executing a secondary additional program loop. The secondary additional program loop comprises: counting a number of third memory cells that have achieved the verify level, the third memory cells being within a third sub-group of the plurality of sub-groups, and determining, based on the number of the third memory cells that have achieved the verify level, whether the third sub-group meets the numeric threshold. If third sub-group does not meet the numeric threshold, the method further comprises increasing the voltage of the programming pulses, applying one or more of the programming pulses to the word line, applying the verify voltage to the word line, and repeating the secondary additional program loop. If the second sub-group meets the numeric threshold, the method further comprises executing a tertiary additional program loop. The tertiary additional program loop comprises: counting a number of fourth memory cells that have achieved the verify level, the fourth memory cells being within a fourth sub-group of the plurality of sub-groups, determining, based on the number of the fourth memory cells that have achieved the verify level, and whether the fourth sub-group meets the numeric threshold. If the fourth sub-group does not meet the numeric threshold, the method further comprises increasing the voltage of the programming pulses, applying one or more of the programming pulses to the word line, applying the verify voltage to the word line, and repeating the tertiary additional program loop.

According to an aspect of an exemplary embodiment, a non-volatile computer-readable medium having recorded thereon a program which, when executed by a processor, causes the processor to execute one or more aspects of the method described above.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
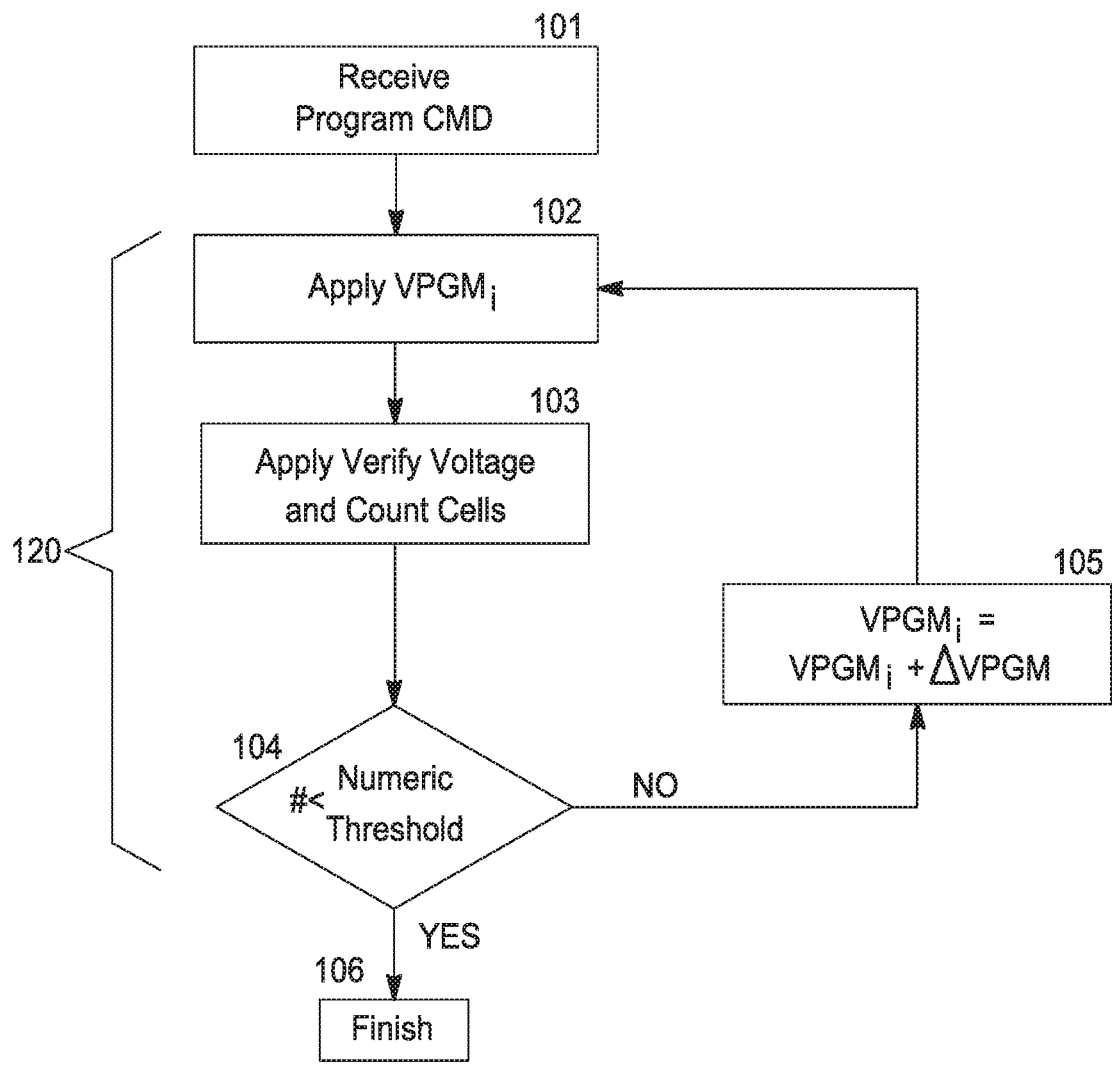
FIG. 1 illustrates a related art programming method.
Figure 2A:
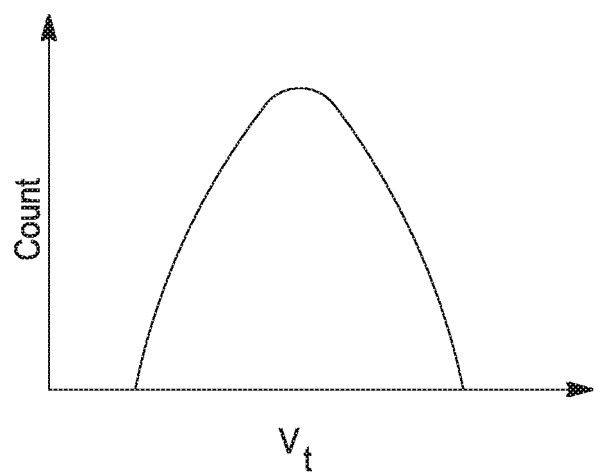
FIG. 2A illustrates an exemplary initial Vt distribution.
Figure 2B:
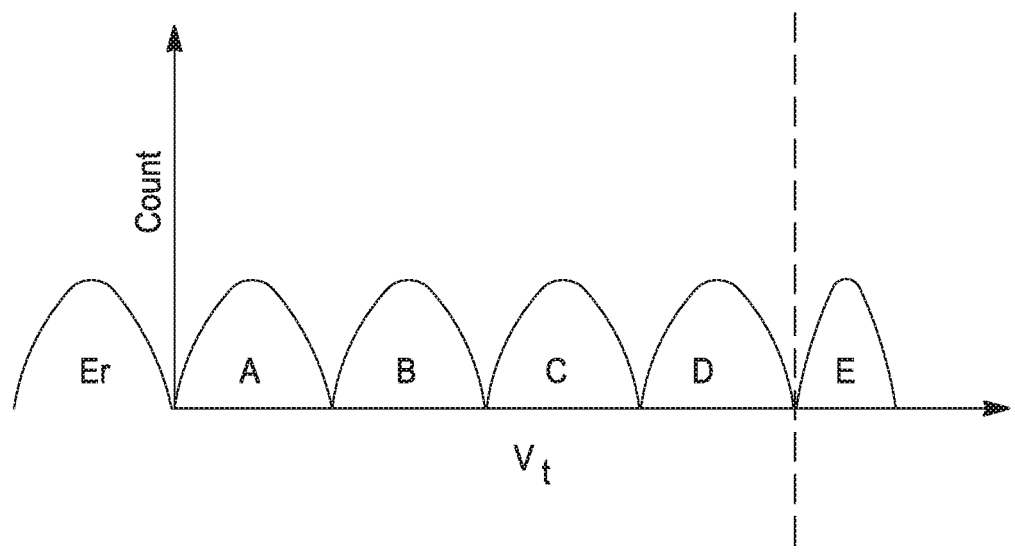
FIG. 2B illustrates exemplary Vt distributions in states A-E reached after arbitrary numbers of repeated program loops.
Figure 3A:
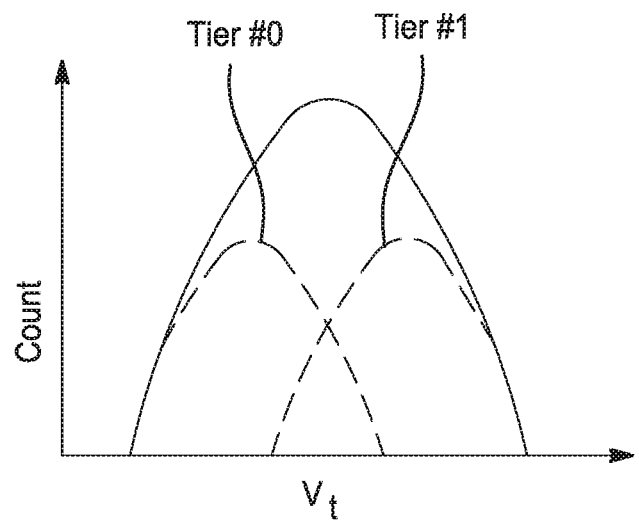
FIG. 3A illustrates an exemplary initial Vt distribution of cells of a word line, divided into tier #0, including slow cells, and tier #1 including fast cells.
Figure 3B:
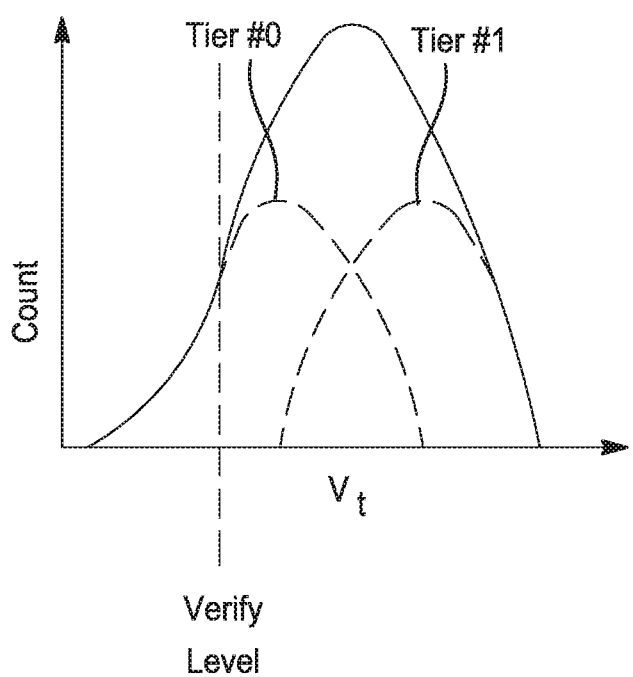
FIG. 3B illustrates the cells of the word line of FIG. 3A after an arbitrary number of program loops.

Reference will now be made in detail to exemplary embodiments which are illustrated in the accompanying drawings, wherein like reference numerals refer to like elements throughout. In this regard, the exemplary embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., and "primary," secondary," tertiary," etc., may be used herein to describe various operations, elements, components, regions, layers and/or sections, these operations, elements, components, regions, layers and/or sections may not be limited by these terms. These terms are used only to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er," "-or," "module," and "unit" described in the specification refer to an element for performing at least one function or operation, and may be implemented in hardware, software, or the combination of hardware and software.

Various terms are used to refer to particular system components. Different companies may refer to a component by different names—this document does not intend to distinguish between components that differ in name but not in function.

A detailed description of matters of these exemplary embodiments that are obvious to those of ordinary skill in the technical field to which these exemplary embodiments pertain may be omitted herefrom.

This description references 3D NAND memory devices. However, it should be understood that the description herein may be likewise applied to other memory devices.

As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include, but are not limited to, flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM).

As noted above, in order to provide faster programming, a 1-tier scan may be performed. Although a word line divided into 16 tiers is described, a word line may be divided into greater or fewer than 16 tiers. However, the problem of a related art 1-tier scan resulting in a scan of a fast tier, which is not adequately representative of the cells of the word line as a whole, needs to be addressed. The resultant lower tail, described above with respect to the related art, may result in a failure to read the programmed word line. In other words, the related art 1-tier scan fails when variation among the cells is involved.

Figure 5:
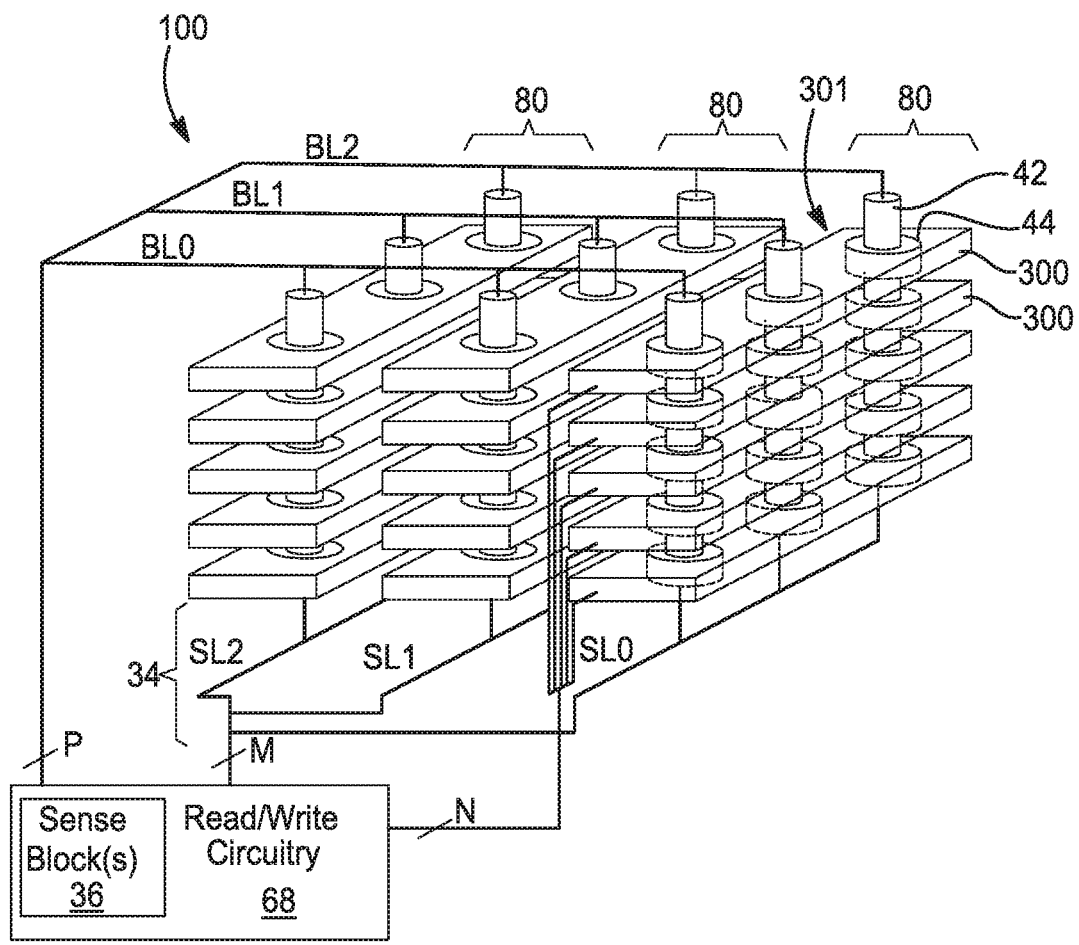
FIG. 5 illustrates a diagram of an exemplary 3D NAND memory.

FIG. 5 illustrates a diagram of an exemplary 3D NAND memory 100. The memory 100 includes multiple physical layers that are monolithically formed above a substrate 34, such as a silicon substrate.

Storage elements, for example memory cells 301, are arranged in arrays in the physical layers. A memory cell 301 includes a charge trap structure 44 between a word line 300 and a conductive channel 42. Charge can be injected into or drained from the charge trap structure 44 via biasing of the conductive channel 42 relative to the word line 300. For example, the charge trap structure 44 can include silicon nitride and can be separated from the word line 300 and the conductive channel 42 by a gate dielectric, such as a silicon oxide. An amount of charge in the charge trap structure 44 affects an amount of current through the conductive channel 42 during a read operation of the memory cell 301 and indicates one or more bit values that are stored in the memory cell 301.

The 3D memory 100 includes multiple erase blocks 80. Each block 80 includes a "vertical slice" of the physical layers that includes a stack of word lines 300. Multiple conductive channels 42 (having a substantially vertical orientation, as shown in FIG. 5) extend through the stack of word lines 300. Each conductive channel 42 is coupled to a storage element in each word line 300, forming a NAND string of storage elements, extending along the conductive channel 42. FIG. 5 illustrates three blocks 80, five word lines 300 in each block 80, and three conductive channels 42 in each block 80 for clarity of illustration. However, the 3D memory 100 can have more than three blocks, more than five word lines per block, and more than three conductive channels per block.

A read/write circuitry 68 is coupled to the conductive channels 420 via multiple conductive lines: bit lines, illustrated as a first bit line BL0, a second bit line BL1, and a third bit line BL2 at a first end of the conductive channels (e.g., an end most remote from the substrate 34) and source lines, illustrated as a first source line SL0, a second source line SL1, and a third source line SL2, at a second end of the conductive channels (e.g., an end nearer to or within the substrate 234). The read/write circuitry 68 is illustrated as coupled to the bit lines BL0-BL2 via "P" control lines, coupled to the source lines SL0-SL2 via "M" control lines, and coupled to the word lines 300 via "N" control lines.

Each of P, M, and N can have a positive integer value based on the specific configuration of the 3D memory 100.

Each of the conductive channels 42 is coupled, at a first end to a bit line BL, and at a second end to a source line SL. Accordingly, a group of conductive channels 42 can be coupled in series to a particular bit line BL and to different source lines SL.

It is noted that although each conductive channel 42 is illustrated as a single conductive channel, each of the conductive channels 42 can include multiple conductive channels that are in a stack configuration. The multiple conductive channels in a stacked configuration can be coupled by one or more connectors. Furthermore, additional layers and/or transistors (not illustrated) may be included as would be understood by one of skill in the art.

The read/write circuitry 68 facilitates and/or effectuates read and write operations performed on the 3D memory 100. For example, data can be stored to storage elements coupled to a word line 300 and the read/write circuitry 68 can read bit values from the memory cells 301 using one or more sense blocks 36. As another example, the read/write circuitry 68 can apply selection signals to control lines coupled to the word lines 300, the bit lines BL, and the source lines SL to cause a programming voltage (e.g., a voltage pulse or series of voltage pulses) to be applied across selected storage element(s) 44 of the selected word line 300.

The read/write circuitry 68 includes one or more sense blocks 36. The sense blocks 36 are utilized to read or sense one or more values stored in a memory cell 301. In one approach, one sense block 36 is provided for a group of NAND strings, each of which is coupled to a particular bit line BL. Each sense block 36 can include a memory controller (not illustrated in FIG. 5). Each sense block 36 also includes a sense module for each NAND string. Alternatively, a sense block 36 can be coupled to an interval of bit lines, such as even or odd numbered bit lines.

During a read operation, a controller can receive a request from a host device, such as a computer, smartphone, or laptop computer. The controller can cause the read/write circuitry 68 to read bits from particular storage elements of the 3D memory 100 by applying appropriate signals to the control lines to cause storage elements of a selected word line to be sensed. Accordingly, the 3D memory 100 having multiple conductive channels in a stacked configuration can be configured to read from and write data to one or more storage elements.

Figure 7:
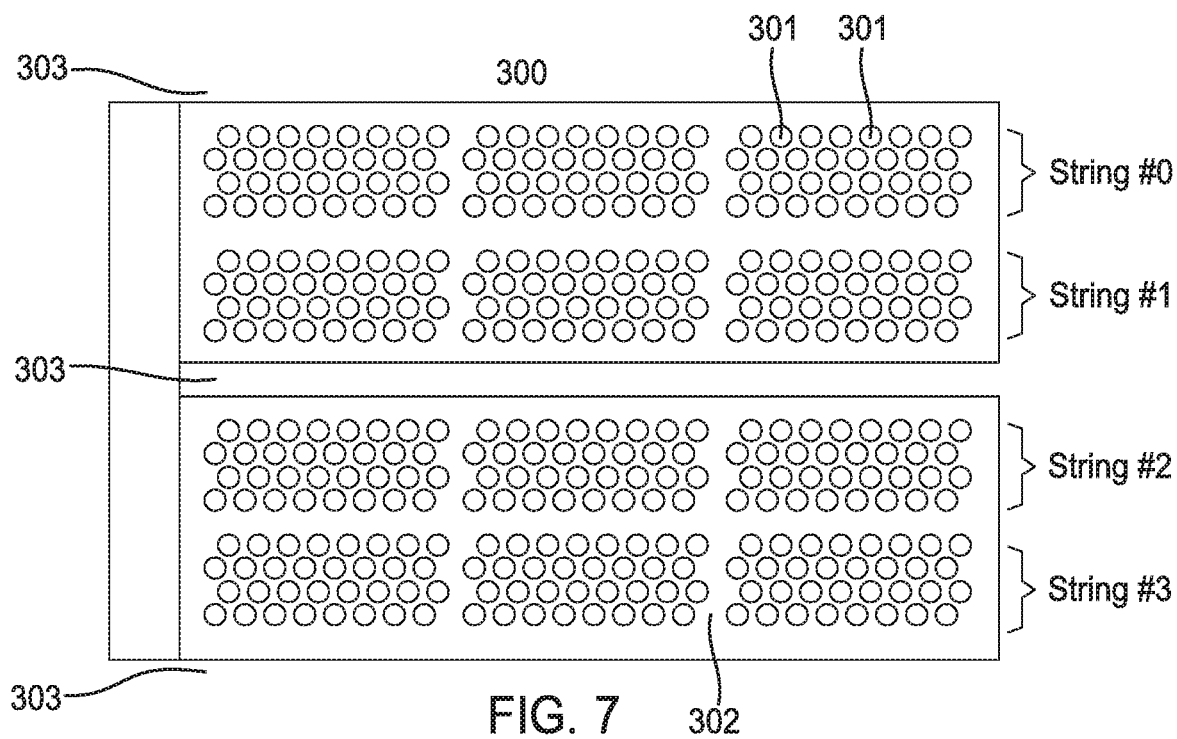
FIG. 7 illustrates a cross-sectional view of one word line.

FIG. 7 illustrates a cross-sectional view of an exemplary word line 300 of cells 301. The cells 301 may be divided into strings #0, #1, #2, and #3, as shown. As discussed above, each of the cells includes a cross-section of a conductive channel. In an ideal situation, each cell would be physically identical to each other cell. However, in reality, due in part to variations in manufacture, the physical structure of a cell may vary slightly from one cell to another such that certain cells may program faster than other cells.

As shown in FIG. 7, certain strings (string #1 and string #2) are separated by trenches 303, formed through the alternating layers of oxide and nitride, and there are additional trenches 303 outside of the outer strings (string #0 and string #3). The cells (or memory holes) that are adjacent to the trenches are referred to as "outer" memory holes, while those further from the trenches are referred to as "inner" memory holes.

Some manufacturing processes for 3D memory can include film deposition processes that tend to dominate over etching processes performed during manufacturing. For these types of manufacturing processes, the outer memory holes will generally program slower than the inner memory holes. However, other manufacturing processes for 3D memory can include etching processes that tend to dominate over film deposition processes during manufacturing. For these types of manufacturing processes, the inner memory holes will generally program slower than the outer memory holes. It should be noted, however, that the physical position of a sub-group of memory cells within the 3D memory structure is not always dispositive of its relative programming speed due to this variation introduced during the manufacturing process or as a result of wear induced by usage of the device. Moreover, cycling degradation can also cause the relative programming speed of different memory cells, or sub-groups of memory cells, to shift over time.

As discussed above, cells of a word line may be divided into sub-groups called "tiers." Each tier comprises a distinct group of cells in electrical communication with a particular sense amplifier group. Each bit line is coupled to a sense amplifier group. Thus, each tier comprises a group of memory cells in electrical communication with a particular sense amplifier group via a bit line.

Figure 6:
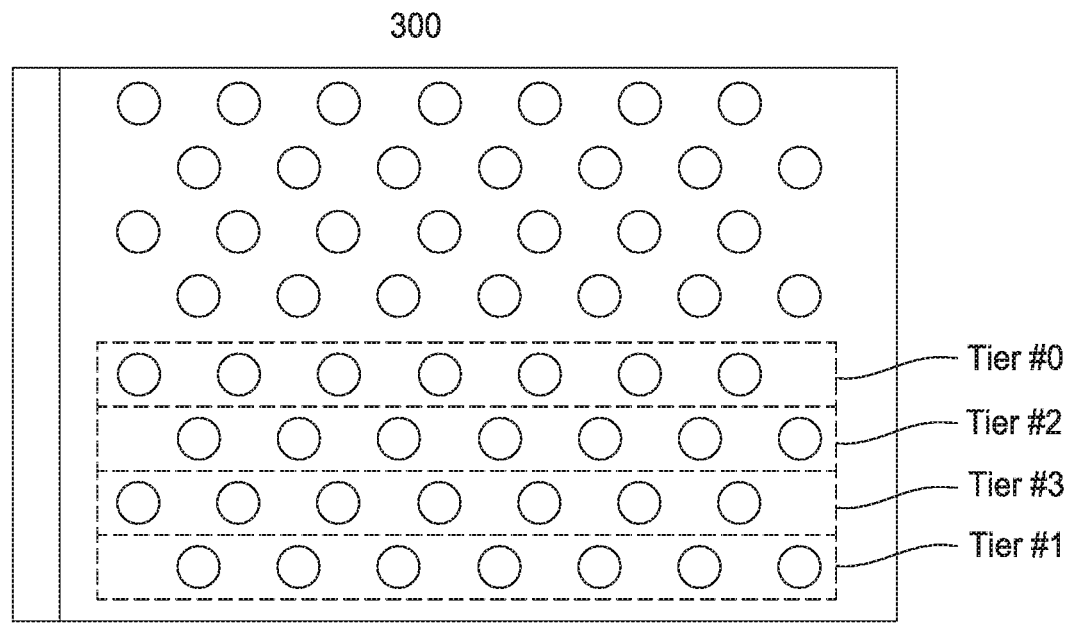
FIG. 6 illustrates a cross-sectional view of one word line divided into tiers #0, #1, #2, and #3 according to an exemplary embodiment.

FIG. 6 illustrates an exemplary word line 300 of cells to be programmed and scanned. As shown, the cells may be divided into tiers including tiers #0, #1, #2, and #3. In this case, tier #0 includes the innermost cells, tier #1 includes the outermost cells, tier #2 includes cells adjacent to the innermost cells, and tier #3 includes cells adjacent to the outermost cells. It is noted, however, that this is merely exemplary, and that the word line 300 may be divided into tiers in a manner different from that illustrated in FIG. 6.

Figure 4A:
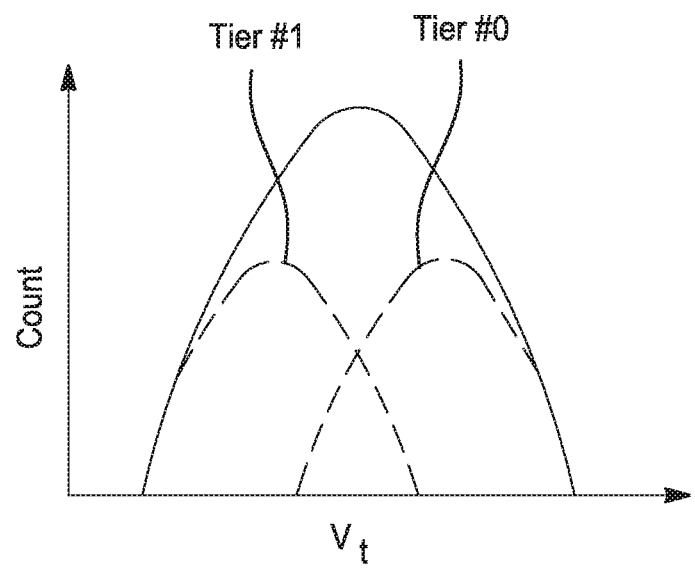
FIG. 4A illustrates an exemplary initial Vt distribution of cells of a word line, divided into tier #0, including fast cells, and tier #1 including slow cells.
Figure 4B:
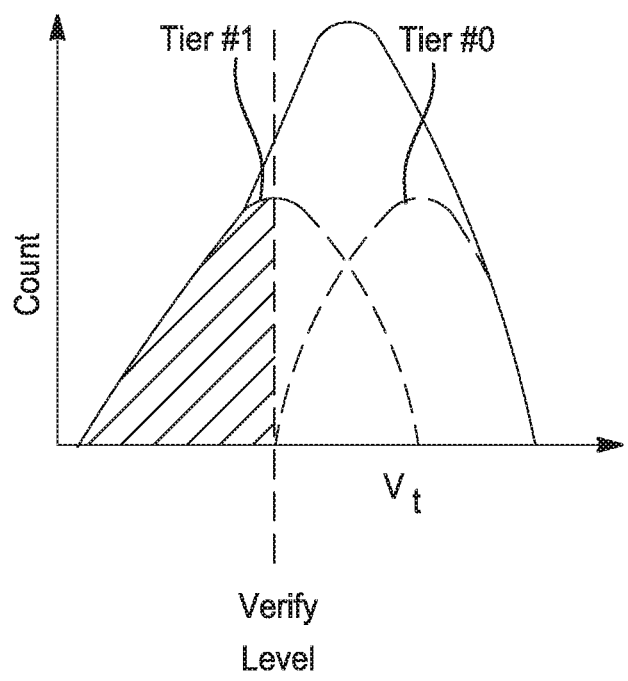
FIG. 4B illustrates the cells of the word line of FIG. 4A after an arbitrary number of program loops.

Referring back to the related-art 1-tier scan method, the tier including the inner cells (tier #0) is typically selected for the 1-tier scan, as this tier is presumed to be a slow tier, based in part on a particular manufacturing process, as noted above. However, as discussed, there are also manufacturing operations or other variations which result in tier #0, including inner cells, being a fast tier. In such a situation, the related art 1-tier scan indicates that the numeric threshold has been reached, when in fact, this is not representative of the cells of the word line, as discussed above with respect to FIGS. 4A and 4B.

Figure 8:
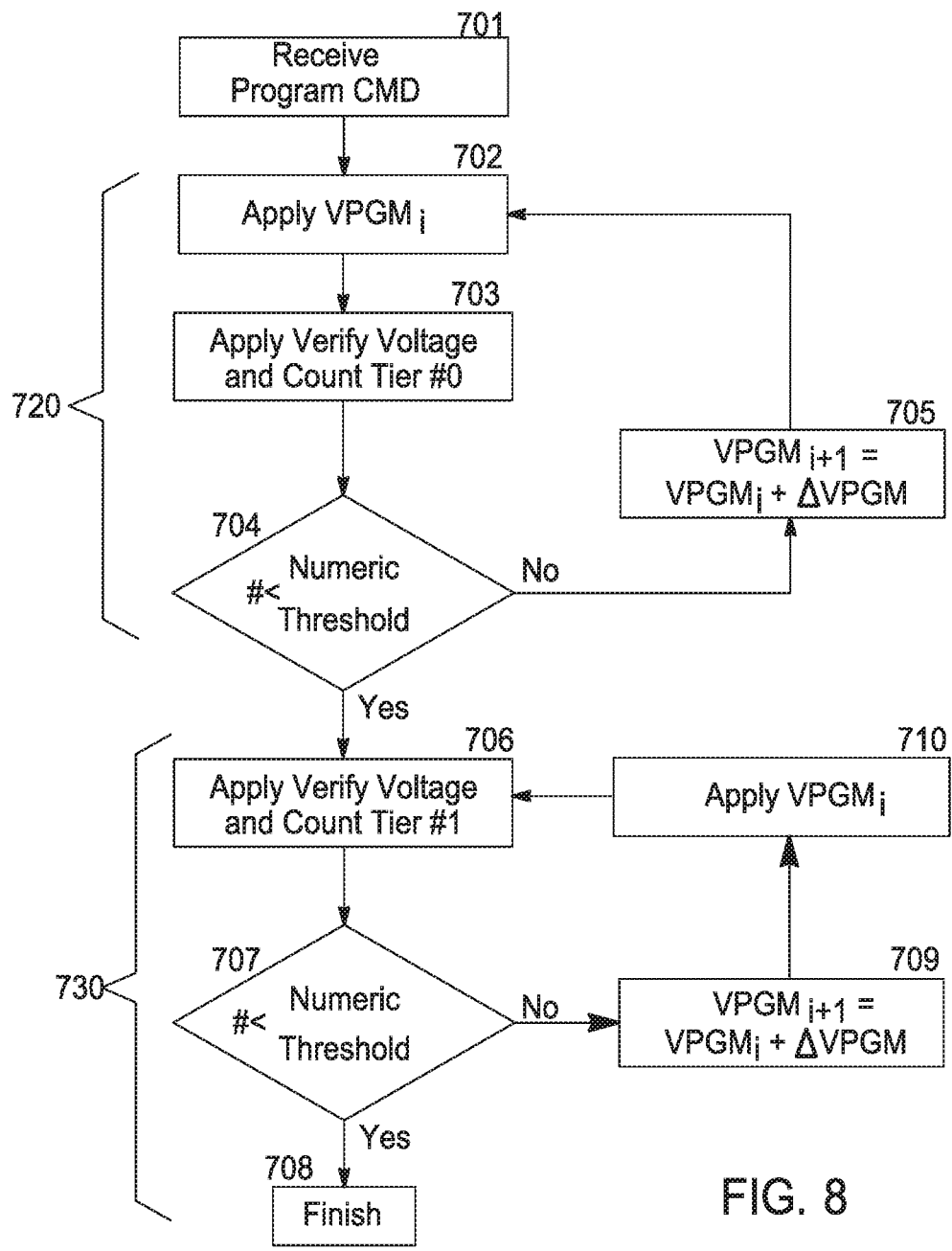
FIG. 8 illustrates a programming method including a dynamic 1-tier scanning method, according to an exemplary embodiment.

FIG. 8 illustrates a dynamic 1-tier scan method according to an exemplary embodiment. The methods described herein may be used with any of a variety of different the memory devices and systems, including those described herein and any other suitable memory devices and systems that may be envisioned.

According to this exemplary embodiment, a program command is received (701), and the program loop 720 is initiated and performed a number of times i (1<i<n). In the first program loop, a first programming voltage $VPGM_1$ is applied to each of the cells via the word line (702). The verify voltage is then applied to the word line and the cells of tier #0 are counted to determine which of the cells of tier #0 have a Vt greater than the verify level (703). Tier #0 is selected because it includes the innermost cells, presumed to be slow cells. Based on the count of the cells of tier #0, it is determined whether a number (or percentage) of the counted cells which have not reached the verify level # is less than the numeric threshold (704). If the number (or percentage) of the counted cells not achieving the verify level # is greater than the numeric threshold (704: NO), the process continues and another program loop 720 is performed. In each subsequent program loop, 1-n, the VPGM is increased, such that $VPGM_{i+1}=VPGM_i+\Delta VPGM$ (705), and the increased $VPGM_{i+1}$ is applied to the word line (702). However, if the number (or percentage) of the counted cells not achieving the verify level is less than the numeric threshold (704: YES), an additional loop 730 is initiated.

In the first loop of the additional program loop 730, the verify voltage is applied to the word line and cells of an additional selected tier #1 are counted in order to determined which cells of the additional selected tier #1 have a Vt greater than the verify level (706). Tier #1 is selected as the additional tier because it includes the outermost cells, presumed to be fast cells. Based on the count of the cells of tier #1, it is determined whether a number (or percentage) of counted cells which have not reached the verify level is less than the numeric threshold (707). If the number (or percentage) of the counted cells not achieving the verify level is greater than the numeric threshold (707: NO), the process continues and proceeds with another additional loop 730. The VPGM is increased, such that $VPGM_{i+1}=VPGM_i+\Delta VPGM$ (709); the word line is programmed again with the increased $VPGM_{i+1}$ (710); the verify voltage is again applied to the word line, and the cells of tier #1 are counted again (706). If the number (or percentage) of the cells not achieving the verify level is less than the numeric threshold (707: YES), the process is finished (708).

Figure 9A:
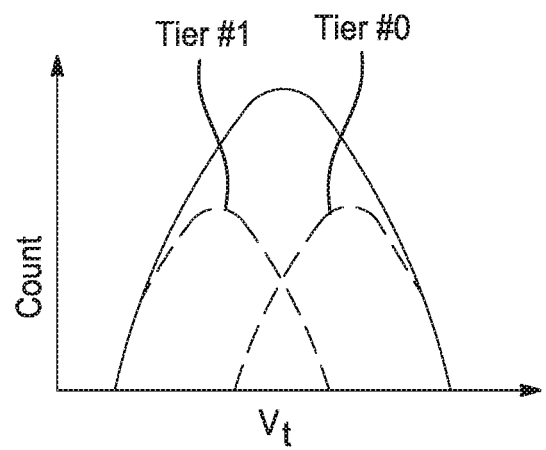
FIG. 9A illustrates exemplary results when a 1-tier scan is performed on tier #0 which is a slow tier.
Figure 9A:
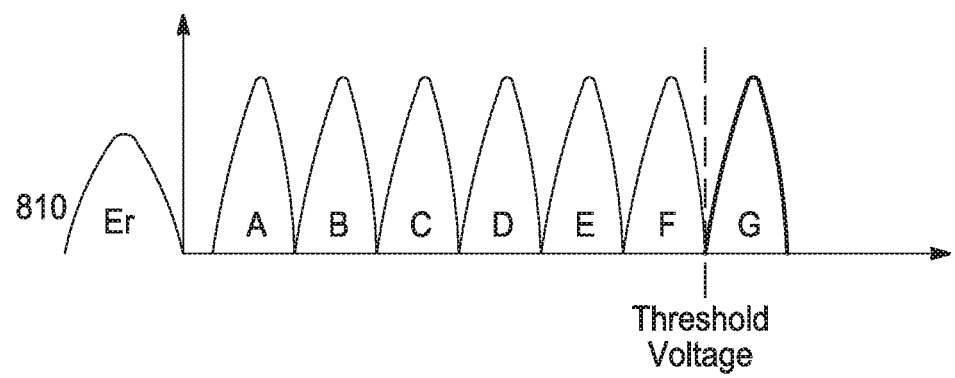
Figure 9A:
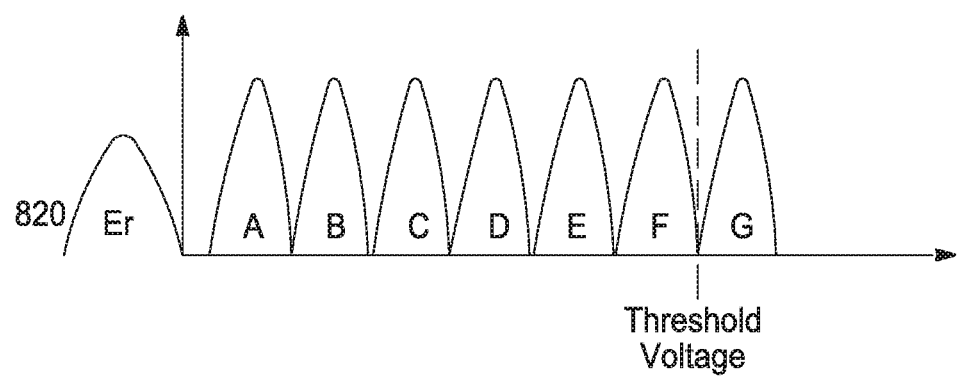
Figure 9B:
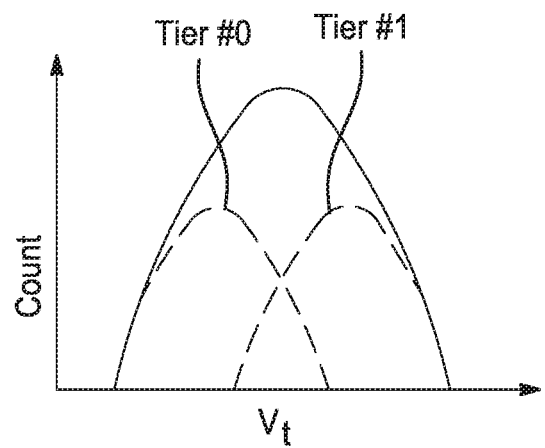
FIG. 9B illustrates exemplary results when a 1-tier scan is performed on tier #0 which is a fast tier.
Figure 9B:
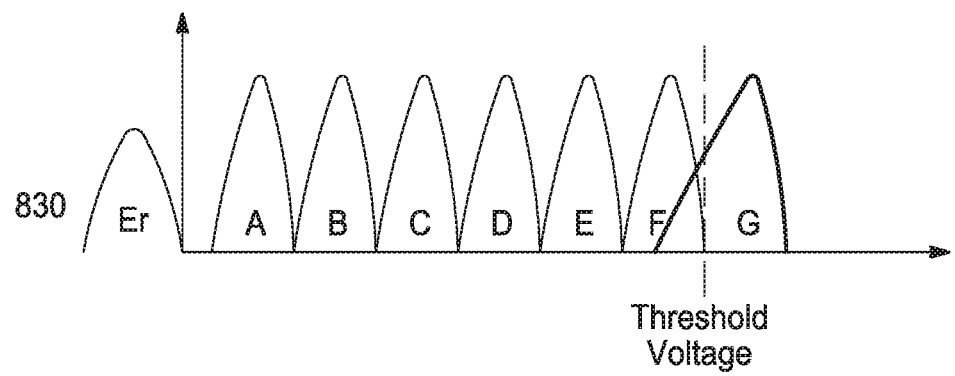
Figure 9B:
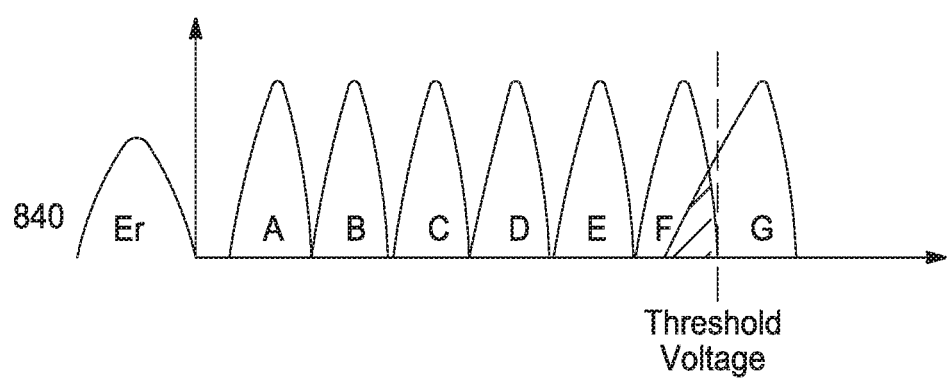

FIGS. 9A and 9B illustrate exemplary results when the related art 1-tier scan is performed on tier #0 which is a slow tier (FIG. 9A), and when the related art 1-tier scan is performed on tier #0 which is a fast tier (FIG. 9B). As discussed with respect to FIG. 1, when programming is performed using the related-art 1-tier scanning method, in each program loop 120, the cells of a single tier (tier #0 including the innermost cells), which have a Vt greater than a verify level, are counted. As shown in the Vt distribution chart in the example of FIG. 9A, the counted tier #0 is a slow tier, and tier #1 is a fast tier. As discussed above, the tier having the inner cells is selected for counting, as it is predicted that this tier will be slow. According to this example, when a number of program loops have been performed (resulting in states A-G of FIG. 9A), in the last program loop, the count of the cells of tier #0 indicates that the number (or percentage) of cells of tier #0 which have achieved the verify level is less than the numeric threshold (810), and the program loops are finished. In this example of FIG. 9A, as the cells of tier #0 are actually slow cells, and the cells of tier #1 are actually fast cells, when the verify scan indicates that the counted cells of tier #0 satisfy the numeric threshold, the cells of tier #1 will also satisfy the numeric threshold, as the final Vt distribution G shows 820. Thus, no further program loops are needed, and the final Vt distribution is acceptable.

In contrast to the example of FIG. 9A, as shown in the Vt distribution chart in the example of FIG. 9B, the counted tier #0, though predicted to be a slow tier due to containing the innermost cells, is actually a fast tier, and tier #1 is a slow tier. According to this example, when the same number program loops have been performed (resulting in states A-G of FIG. 8G), in the last program loop, the count of the cells of tier #0 which have a Vt greater than the verify level, indicates that the number (or percentage) of cells of tier #0 which have achieved the verify level is less than the numeric threshold (830), and the program loops are finished. However, in actuality, because the counted tier #0 is the fastest tier, the true Vt distribution after this last loop includes a lower tail indicating that there are many cells that have not yet reached the verify level, as shown in the shaded region of FIG. 9B. Therefore, although no further program loops are performed, the final Vt distribution 840 is not acceptable. This illustrates the problem inherent with the related art method of FIG. 1.

Figure 10A:
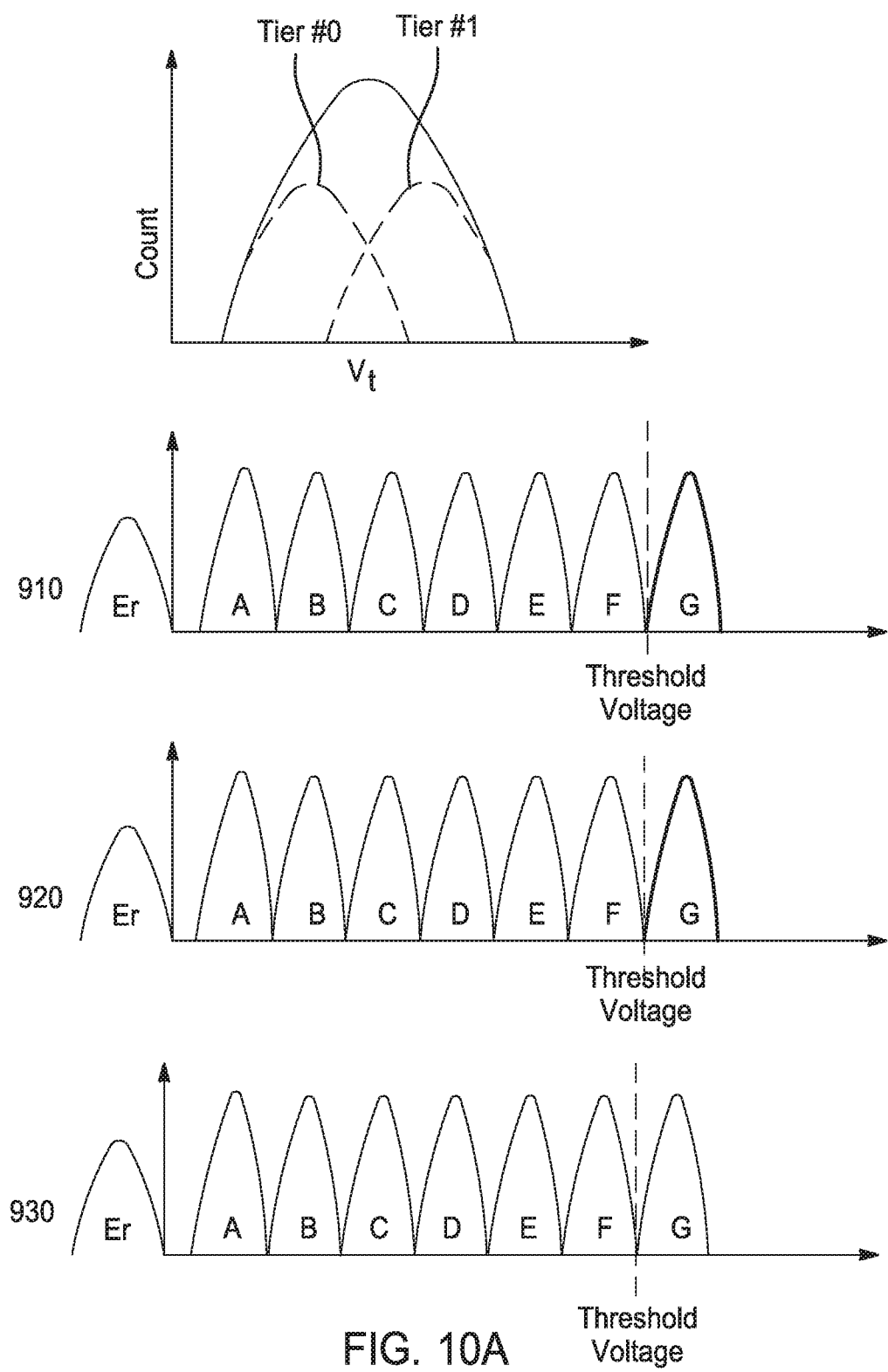
FIG. 10A illustrates exemplary results when a dynamic 1-tier scan is performed including a scan of tier #0 which is a slow tier and a scan of tier #1 which is a fast tier, according to an exemplary embodiment.
Figure 10B:
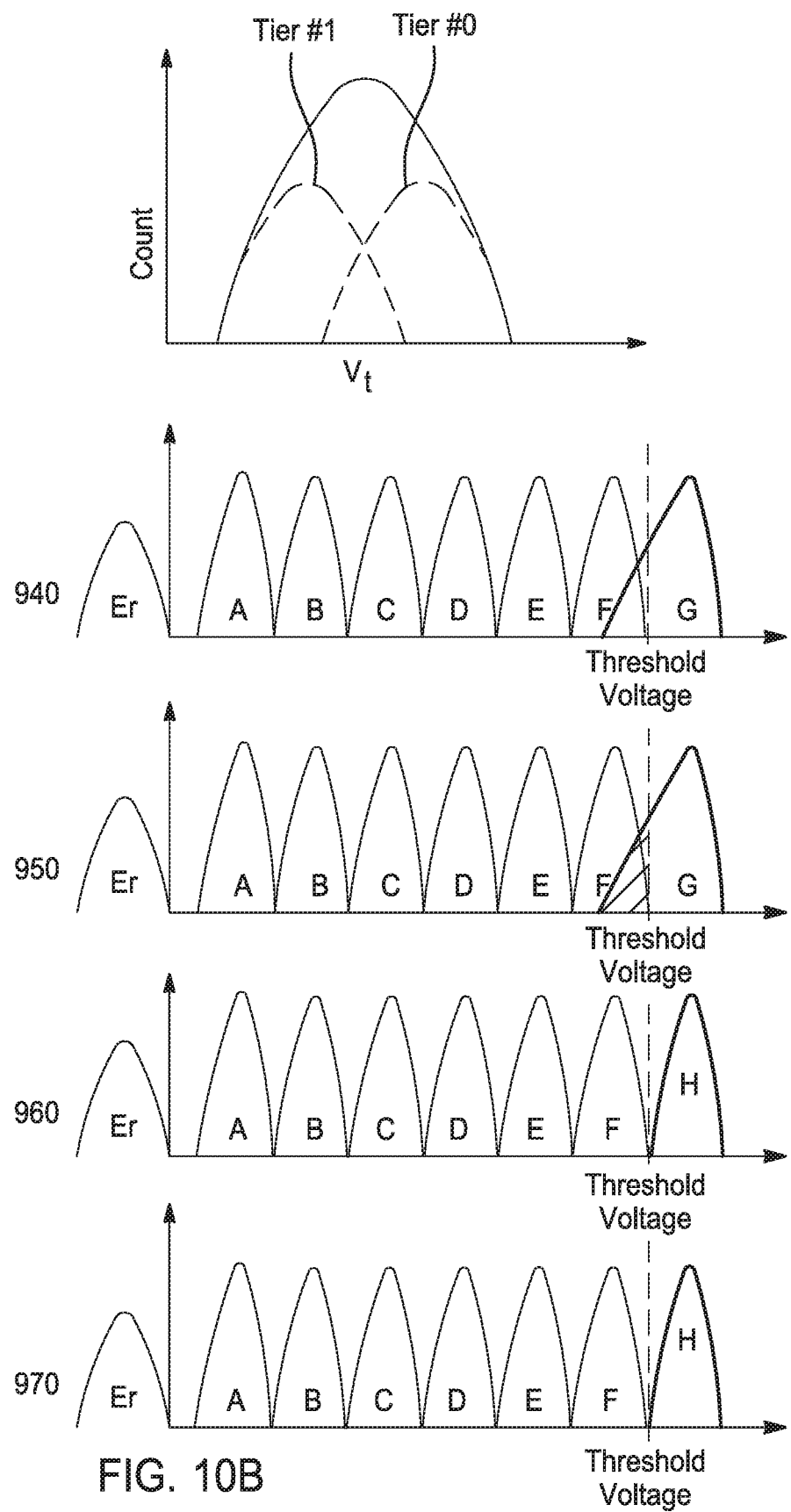
FIG. 10B illustrates exemplary results when a dynamic 1-tier scan is performed including a scan of tier #0 which is a fast tier, and a scan of tier #1 which is a slow tier, according to an exemplary embodiment.

In contrast to FIGS. 9A and 9B, FIGS. 10A and 10B illustrate exemplary results when a dynamic 1-tier scan is performed according to an exemplary embodiment, when a 1-tier scan is first performed on tier #0 which is a slow tier (FIG. 10A) and when a 1-tier scan is first performed on tier #0 which is a fast tier (FIG. 10B).

As with the related art examples of FIGS. 9A and 9B, with respect to the exemplary embodiments of FIGS. 10A and 10B, a program loop 720 is performed and includes a 1-tier scan of tier #0 in which the cells of tier #0 having a Vt higher than the verify level are counted. Tier #0 is selected because it includes the innermost cells which are presumed to be slow.

As shown in the Vt distribution chart, in the example of FIG. 10A, tier #0 is a slow tier, and tier #1 is a fast tier, as in the related art example of FIG. 9A. As with the related art example of FIG. 9A, according to this exemplary embodiment of FIG. 10A, when a number of program loops 720 have been performed (resulting in states A-G of FIG. 10A), in the last program loop, the count of the cells of tier #0 indicates that the number (or percentage) of cells of tier #0 which have achieved the verify level is less than the numeric threshold (910), and the program loop 720 is finished. In accordance with the dynamic 1-tier scan of FIG. 8, the additional program loop 730 is then initiated, and tier #1 is selected for the verify scan, as it contains the outermost cells, and is therefore predicted to be a fast tier. In the first additional program loop, prior to applying any VPGM, the count of the cells of tier #1 indicates that the number (or percentage) of cells of tier #1 which have achieved the verify level is less than the numeric threshold (920), and the additional program loop is finished. In this example of FIG. 10A, as the cells of tier #0 are actually slow cells, and the cells of tier #1 are actually fast cells, when the verify scan performed on the tier #0 cells in the initial program loop indicates that the counted cells of tier #0 satisfy the numeric threshold, the verify scan performed on the tier #1 cells in the additional program loop also indicates that the counted cells of tier #1 satisfy the numeric threshold, as the final Vt distribution 930 shows. Thus, no further program loops are needed, and the final Vt distribution is acceptable.

In contrast to the example of FIG. 10A, as shown in the Vt distribution chart of FIG. 10B, the tier #0 selected for the initial program loop, though predicted to be a slow tier due to containing the innermost cells, is actually a fast tier, and tier #1 is a slow tier. According to this exemplary embodiment, when the number of program loops 720 have been performed (resulting in states A-G of FIG. 10B, 940), in the last loop, the count of the cells of tier #0 which have a Vt higher than the verify level indicates that the number (or percentage) of the cells of tier #0 that have achieved the verify level is less than the numeric threshold, and that the program loop is finished. However, in actuality, because the scanned tier #0 is a fast tier, the true Vt distribution of all of the cells, at state G, after the last program loop, includes a lower tail indicating that there are many cells that have not yet reached the verify level, shown as the shaded region of 950.

In contrast to the related art of FIG. 1, according to this exemplary embodiment of a dynamic 1-tier scan, the process is not complete, and another, additional loop 730 is performed. In this case, as shown in FIG. 8, the additional program loop 730 is initiated by scanning tier #1 selected for the additional loop (706). Since the scan of tier #1, in this example, includes the count of the slow cells of tier #1, this scan indicates that the numeric threshold has not been met. Therefore, in the first additional loop, the VPGM is raised (709) and applied again to the word line. The subsequent count of the cells of tier #1 that have a Vt higher than the verify level indicates that the number (or percentage) of cells of tier #1 which have achieved the verify level is less than the numeric threshold (960), and that the additional program loop is finished. Thus, as is evident from a comparison of FIGS. 9B and 10B, the additional program loop may rectify the issue of the lower tail, and the final Vt distribution is acceptable (970). Thus, the use of the exemplary additional program loop, as described with respect to FIGS. 8 and 10B, may remedy the problem associated with the related-art 1-tier scan.

Applicant notes that according to the exemplary embodiment of FIG. 10B, the numeric threshold is achieved after one additional loop. However, as would be understood by one of skill in the art, two or more additional loops, each applying a successively higher VPGM, may be needed.

Figure 11:
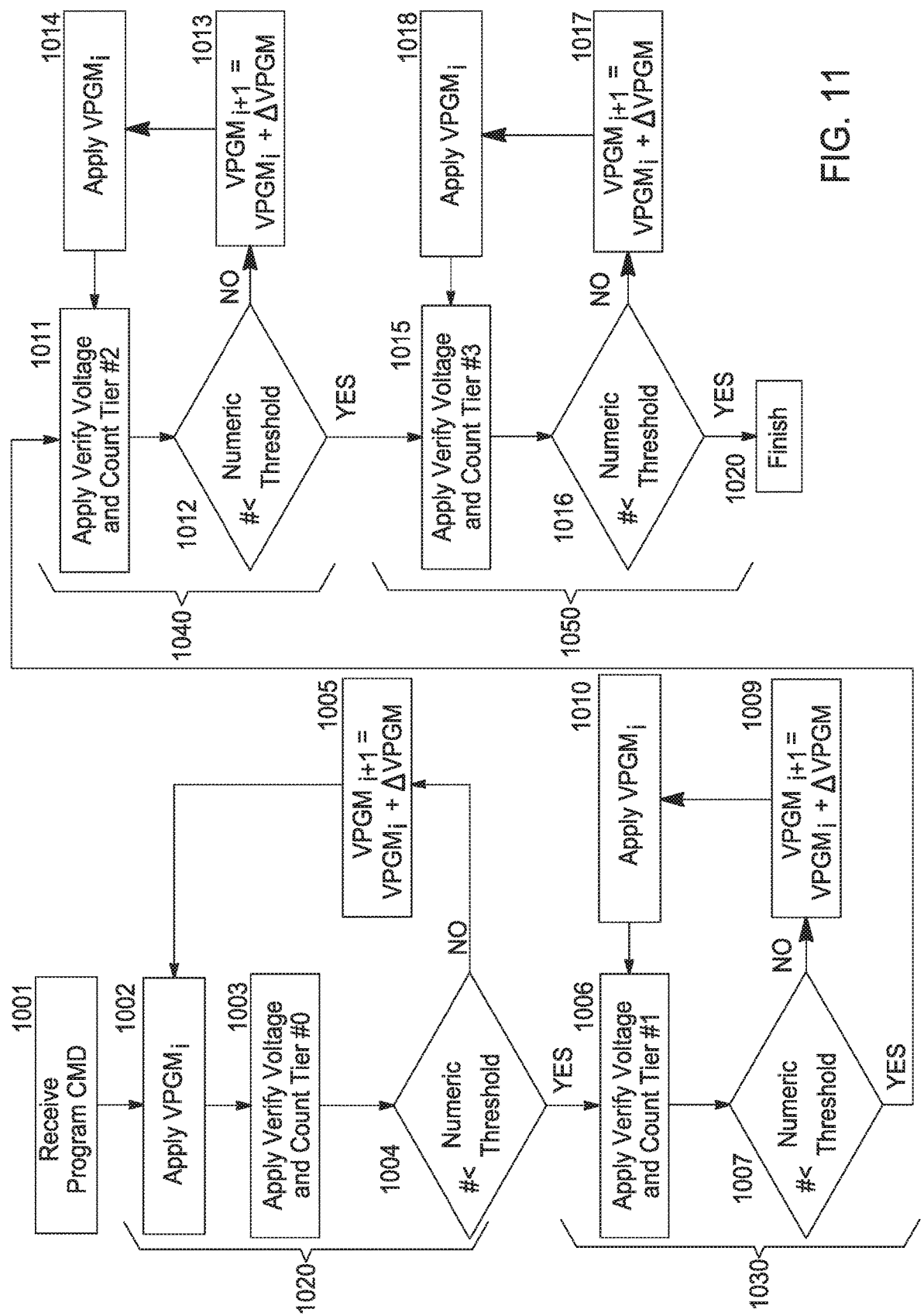
FIG. 11 illustrates a programming method including a dynamic 1-tier scanning method, according to another exemplary embodiment.

FIG. 11 illustrates a dynamic 1-tier scan method according to another exemplary embodiment. In contrast to the dynamic 1-tier method of FIG. 8, according to this embodiment, rather than a single additional program loop 730, there are three additional program loops 1030, 1040, and 1050, such that more than one additional tier is scanned. According to this exemplary embodiment, a program command is received 1001, and the program loop 1020 and the primary additional program loop 1030 are performed a number of times. The program loop 1020 and the primary additional program loop 1030 are comparable, respectively, as the program loop 720 and the additional program loop 730, as discussed with respect to FIG. 8 and the details thereof will not be repeated.

Here, unlike the exemplary embodiment discussed with respect to FIG. 8, if, in the primary additional loop 1030, the number (or percentage) of the cells of tier #1 not achieving the verify level is less than the numeric threshold (1007: YES), the process is not finished. Rather, the process proceeds to a secondary additional program loop 1040.

In this exemplary embodiment of FIG. 11, the word line has been divided into four tiers #0, #1, #2, and #3, as illustrated in FIG. 6. Tier #0 includes the innermost cells and is presumed to be the slowest tier; tier #1 includes the outermost cells and is presumed to the fastest tier; tier #2 includes the cells adjacent to the innermost cells and is presumed to be the second slowest tier; and cell #3 includes the cells adjacent to the outermost cells and is presumed to be the second fastest tier.

Here, if, in the primary additional loop 1030, the number of scanned cells not achieving the verify level is less than the numeric threshold (1007: YES), the process proceeds to the secondary additional loop 1040. In the secondary additional loop, the verify voltage is applied to the word line and the cells of tier #2 having a Vt higher than the verify level are counted (1011), and if the number of cells of tier #1 not achieving the verify level is greater than the numeric threshold (1012: NO), the VPGM is increased (1013) and applied to the word line (1014). The verify voltage is applied to the word line, and the cells of tier #2 having a Vt higher than the verify level are counted (1011). If the number of cells of tier #2 not achieving the verify level is less than the numeric threshold (1012: YES), the process proceeds to a tertiary additional loop 1050.

In the tertiary additional loop, the verify voltage is applied to the word line, and the cells of tier #3 having a Vt higher than the verify level are counted (1015), and if the number of cells of tier #3 not achieving the verify level is greater than the numeric threshold (1016: NO), the VPGM is increased (1017) and applied to the word line (1018). The verify voltage is then applied to the word line, and the cells of tier #3 having a Vt higher than the verify level are counted. If the number of counted cells not achieving the verify level is less than the numeric threshold (1016: YES), the process is finished (1020).

According to this exemplary embodiment, the method includes three additional loops in which cells of tiers #1, #2, and #3 are counted. However, as would be understood by one of skill in the art, there may be more or fewer than three additional loops, and the specific tiers which are scanned may vary.

Figure 12:
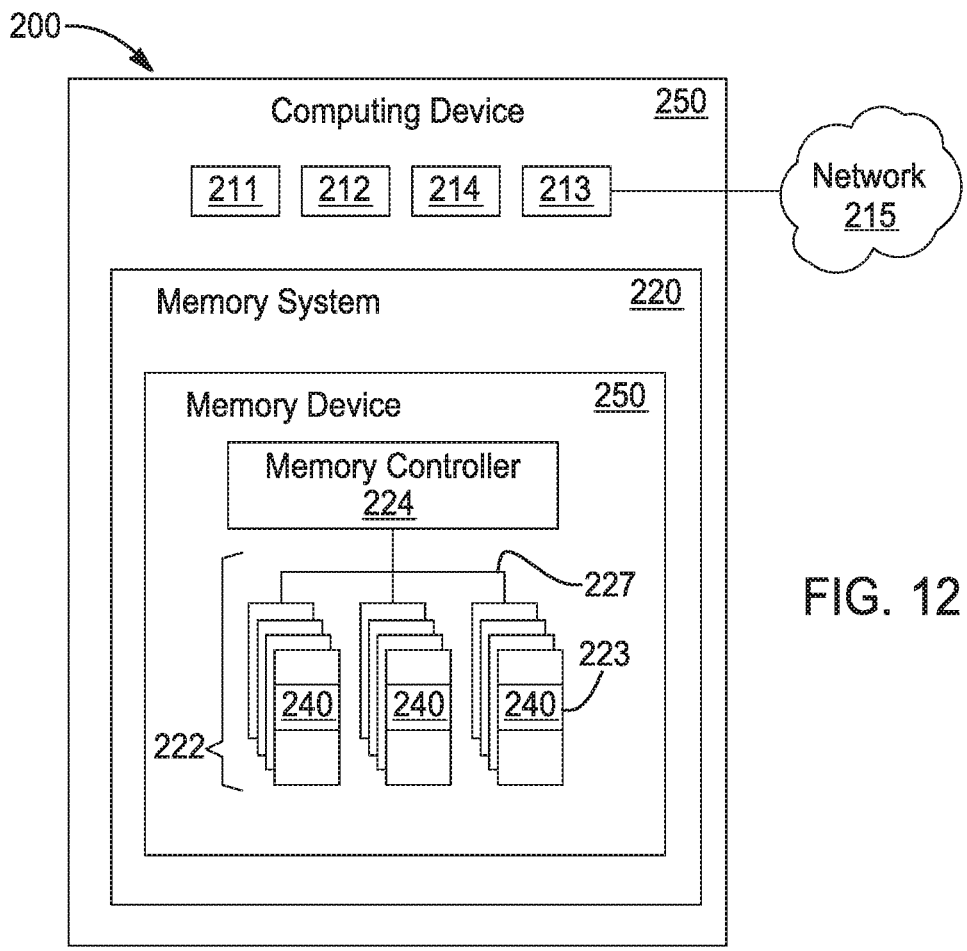
FIG. 12 is schematic block diagram illustrating a system and device configured to implement the method(s) of FIGS. 8 and/or 11, according to an exemplary embodiment.

FIG. 12 is schematic block diagram illustrating a system 200 and device 250 configured to implement the methods of FIGS. 8 and 11, according to an exemplary embodiment. The computing device 250 comprises one or more dynamic 1-tier circuits 240 for memory media 222 of a memory device 220.

The memory device 220 may at least partially operate on and/or in communication with the memory system 200 of a computing device 250 which can include a processor 211, a volatile memory 212, and a communication interface 213. The processor 211 can include one or more central processing units (CPU), one or more general-purpose processors, one or more application-specific processors, one or more processor cores, or the like.

The dynamic 1-tier circuit 240 can be disposed at or toward an edge and/or peripheral of a memory element 223, adjacent and/or next to an array of memory media 222. Alternately, the dynamic 1-tier circuit may be disposed on a different level, layer, and/or plane of an integrated circuit device than an array of memory media 222 (e.g. CMOS or other circuit under the array, parallel with and offset from the array, or the like). The dynamic 1-tier circuit may automatically perform the operations of the methods described herein including, but not limited to for example, automatically determining whether cells of a particular tier have reached the verify level, automatically determining whether the number of cells which have not reached the verify level is less than a numeric threshold.

Figure 13:
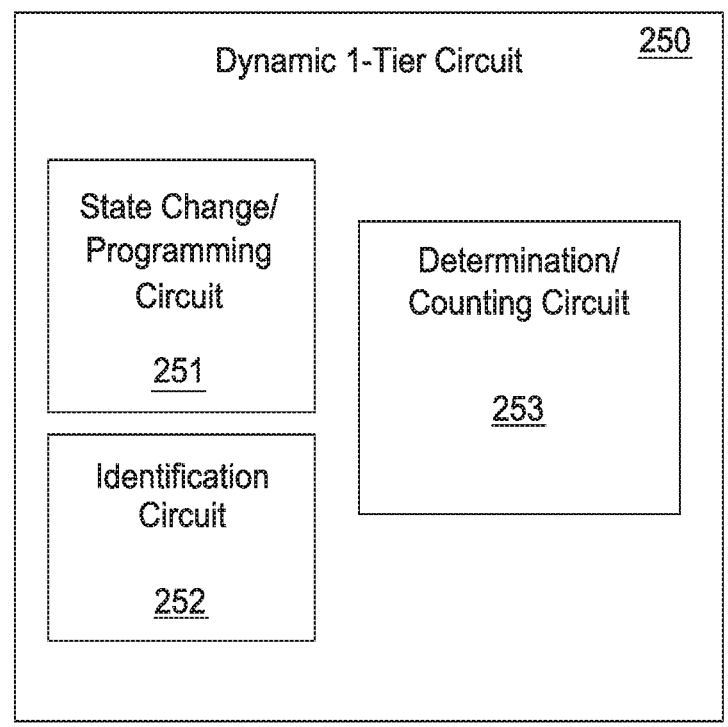
FIG. 13 is a block diagram illustrating a dynamic 1-tier circuit according to an exemplary embodiment.

FIG. 13 is a block diagram illustrating a dynamic 1-tier circuit according to an exemplary embodiment. The dynamic 1-tier circuit includes a state change/programming circuit 251, an identification circuit 252, and a determination/counting circuit 253. The state change/programming circuit may be any circuit configured to execute or deliver one or more program loops and/or one or more additional program loops, as described. For example, the programming circuit 251 may perform any one or more of operations included in loops 720, 730, 1020, 1030, 1040, and 1050, as describe herein with reference to FIGS. 8 and 11.

The determination/counting circuit 253 may be any circuit configured to count a total number of memory cells of any one or more tiers that have achieved a verify level, and to determine whether the numeric threshold has been met. For example, the determination/counting circuit 253 may perform any one or more of operations 704, 707, 1004, 1007, 1012, and 1016, as described herein with reference to FIGS. 8 and 11.

The memory device 220 may be disposed in any one or more various locations with respect to the computing device 210, and may include one or more memory elements 223, such as semiconductor chips or packages or other integrated circuit devices disposed on one or more printed circuit boards, storage housings, and/or other mechanical and/or electrical support structures. For example, the memory device 1120 can comprise one or more direct inline memory module (DIMM) cards, one or more expansion cards and/or daughter cards, a memory card, a universal serial bus (USB) drive, a solid-state-drive (SSD) or other hard drive device, and/or can have another memory and/or storage form factor. The memory device 220 can be integrated with and/or mounted on a motherboard of the computing device 210, installed in a port and/or slot of the computing device 210, installed on a different computing device 210 and/or a dedicated storage appliance on a network 215, in communication with the computing device 210 over an external bus (e.g., an external hard drive), or the like.

An element 223 of memory media 222 may include volatile memory medium 222, such as random-access memory (RAM), dynamic RAM (DRAM), synchronous DRAM (SDRAM), double data rate (DDR) SDRAM, static RAM (SRAM), thyristor RAM (T-RAM), zero-capacitor RAM (Z-RAM), or the like. Alternately, an element 223 of memory media 222 may include a non-volatile memory medium 222, such as ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), magnetic storage media (e.g., hard disk, tape), optical storage media, or the like. Thus, the memory device 220 may rely, for example, on stored voltage levels or stored resistance levels. The one or more elements 223 of memory media 222, in certain embodiments, comprise storage class memory (SCM).

The memory device 220 may be disposed on a memory bus of a processor 211 (e.g., on the same memory bus as the volatile memory 212, on a different memory bus from the volatile memory 212, in place of the volatile memory 212, or the like). Alternately, the memory device 220 may be disposed on a peripheral bus of the computing device 210, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. Alternately, the memory device 1120 may be disposed on a data network 215, such as an Ethernet network, an Infiniband network, Small Computer System Interface (SCSI) remote direct memory access (RDMA) over a network 215, a storage area network (SAN), a local area network (LAN), a wide area network (WAN) such as the Internet, another wired and/or wireless network 215, or the like.

The computing device 210 can additionally include a non-transitory, computer readable storage medium 214. The computer readable storage medium 214 can have stored thereon executable instructions configured to cause the computing device 210 (e.g., processor 211) to perform steps of one or more of the methods described herein. For example, a dynamic 1-tier circuit 240 can include hardware of a memory element 223, computer executable program code of a device driver, firmware of a memory controller 226 and/or a memory media controller for a memory element 223, another electrical component, or the like. A dynamic 1-tier circuit 240 may be integrated on a memory element 223 (e.g., an on-die subgroup selection circuit 240 and/or other integrated hardware). The non-volatile memory controller 226 can be communicatively coupled to the non-volatile memory media 222 by way of a bus 227.

The memory device 220 may include a memory controller 226 which manages one or more memory devices 220 and/or memory elements 223, one or more of which can comprise an on-die dynamic 1-tier circuit 240. The memory device(s) 220 may include recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a memory device 220). Memory units and/or regions can include, but are not limited to: pages, memory divisions, blocks, sectors, collections or sets of physical storage locations (e.g., logical pages, logical blocks), or the like.

It may be understood that the exemplary embodiments described herein may be considered in a descriptive sense only and not for purposes of limitation. Descriptions of features or aspects within each exemplary embodiment may be considered as available for other similar features or aspects in other exemplary embodiments.

While exemplary embodiments have been described with reference to the figures, it will be understood by those of ordinary skill in the art that various changes in form and details may be made therein without departing from the spirit and scope as defined by the following claims.

What is claimed is:

1. A non-volatile memory storage system comprising:
 a memory cell array coupled to a word line, the memory cell array comprising a plurality of memory cells organized into a plurality of distinct sub-groups;
 a dynamic 1-tier circuit comprising a programming circuit and a determination/counting circuit, wherein the dynamic 1-tier circuit is configured to execute a program loop and an additional program loop;
 wherein the program loop comprises:
  the programming circuit applying one or more programming pulses to the word line, and applying a verify voltage to the word line,
  the determination/counting circuit counting a number of first memory cells that have achieved a verify level, the first memory cells being within a first sub-group of the plurality of sub-groups, and determining, based on the number of the first memory cells that have achieved the verify level, whether the first sub-group meets a numeric threshold,
  if the first sub-group does not meet the numeric threshold, the programming circuit increasing a voltage of the programming pulses and repeating the program loop, and
  if the first sub-group meets numeric threshold, the dynamic 1-tier circuit executing the additional program loop;
 wherein the additional program loop comprises:
  the determination/counting circuit counting a number of second memory cells that have achieved the verify level, the second memory cells being within a second sub-group of the plurality of sub-groups, and determining, based on the number of the second memory cells that have achieved the verify level, whether the second sub-group meets the numeric threshold, and
  if the second sub-group does not meet the numeric threshold, the programming circuit increasing the voltage of the programming pulses, applying one or more of the programming pulses to the word line, and applying the verify voltage to the word line, and the dynamic 1-tier circuit repeating the additional program loop.

2. The non-volatile memory storage system according to claim 1, wherein:
 the first memory cells of the first sub-group are each adjacent to a trench, and
 the second memory cells of the second sub-group are spaced apart from the trench, such that the first memory cells are disposed between the second memory cells and the trench.

3. The non-volatile memory storage system according to claim 1, wherein:
 the additional program loop is a primary additional program loop, and the dynamic 1-tier circuit is further configured to execute a secondary additional program loop and a tertiary additional program loop;
 if the second sub-group meets the numeric threshold, the dynamic 1-tier circuit executing the secondary additional program loop;
 the secondary additional program loop comprising:
  the determination/counting circuit counting a number of third memory cells that have achieved the verify level, the third memory cells being within a third sub-group of the plurality of sub-groups, and determining, based on the number of the third memory cells that have achieved the verify level, whether the third sub-group meets the numeric threshold; and
  if the third sub-group does not meet the numeric threshold, the programming circuit increasing the voltage of the programming pulses, applying one or more programming pulses to the word line, and applying the verify voltage to the word line, and the dynamic 1-tier circuit repeating the secondary additional program loop, and
  if the third sub-group meets the numeric threshold, the dynamic 1-tier circuit executing the tertiary additional program loop;
 the tertiary additional program loop comprising:
  the programming circuit applying the verify voltage to the word line;
  the determination/counting circuit counting a number of fourth memory cells that have achieved the verify level, the fourth memory cells being within a fourth sub-group of the plurality of sub-groups, and determining, based on the number of the fourth memory cells that have achieved the verify level, whether the fourth sub-group meets the numeric threshold; and
  if the fourth sub-group does not meet the numeric threshold, the programming circuit increasing the voltage of the programming pulses, applying one or more programming pulses to the word line, and applying the verify voltage to the word line, and the dynamic 1-tier circuit repeating the tertiary additional program loop.

4. The non-volatile memory storage system according to claim 3, wherein:
 the first memory cells of the first sub-group are each adjacent to a trench,
 the second memory cells of the second sub-group are spaced apart from the trench, such that the first memory cells are disposed between the second memory cells and the trench,
 the third memory cells of the third sub-groups are adjacent to the first memory cells and are disposed between the first memory cells and the second memory cells, and the fourth memory cells of the fourth sub-group are adjacent to the second memory cells and are disposed between the third memory cells and the second memory cells.

5. A memory programming method comprising:
executing a program loop comprising:
applying one or more programming pulses to a word line coupled to a memory cell array comprising a plurality of memory cells organized into a plurality of distinct sub-groups,
applying a verify voltage to the word line,
counting a number of first memory cells that have achieved a verify level, the first memory cells being within a first sub-group of the plurality of sub-groups,
determining, based on the number of the first memory cells that have achieved the verify level, whether the first sub-group meets a numeric threshold,
if the first sub-group does not meet the numeric threshold, increasing a voltage of the programming pulse, and repeating the program loop, and
if the numeric threshold is met, executing an additional program loop;
wherein, the additional program loop comprises:
counting a number of second memory cells that have achieved the verify level, the second memory cells being within a second sub-group of the plurality of sub-groups,
determining, based on the number of the second memory cells that have achieved the verify level, whether the second sub-group meets the numeric threshold; and
if the second sub-group does not meet the numeric threshold, increasing the voltage of the programming pulses, applying one or more of the programming pulses to the word line, applying the verify voltage to the word line, and repeating the additional program loop.

6. The method according to claim 5, wherein:
the first memory cells of the first sub-group are each adjacent to a trench, and
the second memory cells of the second sub-group are spaced apart from the trench, such that the first memory cells are disposed between the second memory cells and the trench.

7. The method according to claim 5, wherein: the additional program loop is a primary additional program loop, and the method further comprises:
if the second sub-group meets the numeric threshold, executing a secondary additional program loop;
wherein the secondary additional program loop comprises:
counting a number of third memory cells that have achieved the verify level, the third memory cells being within a third sub-group of the plurality of sub-groups,
determining, based on the number of the third memory cells that have achieved the verify level, whether the third sub-group meets the numeric threshold,
if the third sub-group does not meet the numeric threshold, increasing the voltage of the programming pulses, applying one or more of the programming pulses to the word line, applying the verify voltage to the word line, and repeating the secondary additional program loop, and
if the second sub-group meets the numeric threshold, executing a tertiary additional program loop;

wherein the tertiary additional program loop comprises:
counting a number of fourth memory cells that have achieved the verify level, the fourth memory cells being within a fourth sub-group of the plurality of sub-groups,
determining, based on the number of the fourth memory cells that have achieved the verify level, whether the fourth sub-group meets the numeric threshold, and
if the fourth sub-group does not meet the numeric threshold, increasing the voltage of the programming pulses, applying one or more of the programming pulses to the word line, applying the verify voltage to the word line, and repeating the tertiary additional program loop.

8. The method according to claim 7, wherein:
the first memory cells of the first sub-group are each adjacent to a trench,
the second memory cells of the second sub-group are spaced apart from the trench, such that the first memory cells are disposed between the second memory cells and the trench,
the third memory cells of the third sub-groups are adjacent to the first memory cells and are disposed between the first memory cells and the second memory cells, and
the fourth memory cells of the fourth sub-group are adjacent to the second memory cells and are disposed between the third memory cells and the second memory cells.

9. A non-volatile computer-readable medium having recorded thereon a program which, when executed by a processor, causes the processor to execute a method comprising:
executing a program loop comprising:
applying one or more programming pulses to a word line coupled to a memory cell array comprising a plurality of memory cells organized into a plurality of distinct sub-groups,
applying a verify voltage to the word line,
counting a number of first memory cells that have achieved a verify level, the first memory cells being within a first sub-group of the plurality of sub-groups,
determining, based on the number of the first memory cells that have achieved the verify level, whether the first sub-group meets a numeric threshold,
if the first sub-group does not meet the numeric threshold, increasing a voltage of the programming pulse, and repeating the program loop, and
if the numeric threshold is met, executing an additional program loop;
wherein, the additional program loop comprises:
applying the verify voltage to the word line,
counting a number of second memory cells that have achieved the verify level, the second memory cells being within a second sub-group of the plurality of sub-groups,
determining, based on the number of the second memory cells that have achieved the verify level, whether the second sub-group meets the numeric threshold, and
if the second sub-group does not meet the numeric threshold, increasing the voltage of the programming pulses, applying one or more of the programming pulses to the word line, applying the verify voltage to the word line, and repeating the additional program loop.

10. The non-volatile computer-readable medium according to claim 9, wherein:
   the first memory cells of the first sub-group are each adjacent to a trench, and
   the second memory cells of the second sub-group are spaced apart from the trench, such that the first memory cells are disposed between the second memory cells and the trench.

11. The non-volatile computer-readable medium according to claim 9, wherein the additional program loop is a primary additional program loop, and the method further comprises:
   if the second sub-group meets the numeric threshold, executing a secondary additional program loop;
   wherein the secondary additional program loop comprises:
      applying the verify voltage to the word line,
      counting a number of third memory cells that have achieved the verify level, the third memory cells being within a third sub-group of the plurality of sub-groups,
      determining, based on the number of the third memory cells that have achieved the verify level, whether the third sub-group meets the numeric threshold,
      if the third sub-group does not meet the numeric threshold, increasing the voltage of the programming pulses, applying one or more of the programming pulses to the word line, applying the verify voltage to the word line, and repeating the secondary additional program loop, and
      if the second sub-group meets the numeric threshold, executing a tertiary additional program loop;
   wherein the tertiary additional program loop comprises:
      applying the verify voltage to the word line,
      counting a number of fourth memory cells that have achieved the verify level, the fourth memory cells being within a fourth sub-group of the plurality of sub-groups,
      determining, based on the number of the fourth memory cells that have achieved the verify level, whether the fourth sub-group meets the numeric threshold, and
      if the fourth sub-group does not meet the numeric threshold, increasing the voltage of the programming pulses, applying one or more of the programming pulses to the word line, applying the verify voltage to the word line, and repeating the tertiary additional program loop.

12. The non-volatile computer-readable medium according to claim 11, wherein:
   the first memory cells of the first sub-group are each adjacent to a trench,
   the second memory cells of the second sub-group are spaced apart from the trench, such that the first memory cells are disposed between the second memory cells and the trench,
   the third memory cells of the third sub-groups are adjacent to the first memory cells and are disposed between the first memory cells and the second memory cells, and
   the fourth memory cells of the fourth sub-group are adjacent to the second memory cells and are disposed between the third memory cells and the second memory cells.

\* \* \* \* \*